United States Patent
Medra et al.

(10) Patent No.: US 10,700,655 B2
(45) Date of Patent: Jun. 30, 2020

(54) GAIN-DEPENDENT IMPEDANCE MATCHING AND LINEARITY

(71) Applicant: Qualcomm Incorporated, San Diego, CA (US)

(72) Inventors: Alaaeldien Mohamed Abdelrazek Medra, San Diego, CA (US); David Zixiang Yang, San Diego, CA (US); Kevin Hsi Huai Wang, San Diego, CA (US); Chen Zhai, San Diego, CA (US); Francesco Gatta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/200,405

(22) Filed: Nov. 26, 2018

(65) Prior Publication Data
US 2019/0158048 A1 May 23, 2019

Related U.S. Application Data

(63) Continuation-in-part of application No. 15/940,808, filed on Mar. 29, 2018.
(Continued)

(51) Int. Cl.
*H03F 3/04* (2006.01)
*H03F 9/02* (2006.01)
(Continued)

(52) U.S. Cl.
CPC ............. *H03F 9/02* (2013.01); *H03F 1/223* (2013.01); *H03F 1/565* (2013.01); *H03F 3/195* (2013.01); *H03F 2200/294* (2013.01)

(58) Field of Classification Search
CPC . H03F 9/02; H03F 1/223; H03F 1/565; H03F 3/195; H03F 2200/294
(Continued)

(56) References Cited

U.S. PATENT DOCUMENTS 6,977,552 B2 12/2005 Macedo
8,008,973 B2 8/2011 Fujimoto
(Continued)

FOREIGN PATENT DOCUMENTS

CN 103633946 A 3/2014
WO 2017117129 A1 7/2017

OTHER PUBLICATIONS

US 5,549,077 A1, 04/2003, Jou (withdrawn)
(Continued)

*Primary Examiner* — Khanh V Nguyen
*Assistant Examiner* — Khiem D Nguyen
(74) *Attorney, Agent, or Firm* — Colby Nipper/QUALCOMM Incorporated

(57) ABSTRACT

An integrated circuit is disclosed for gain-dependent impedance matching and linearity. The integrated circuit includes at least two amplifier branches, an input inductor, and at least two degeneration inductors. Each amplifier branch includes a node, an input transistor, and a cascode stage connected between a drain of the input transistor and the node. Respective nodes of the at least two amplifier branches are connected together and respective gates of the input transistors of the at least two amplifier branches are connected together. The input inductor is connected to the respective gates, and the at least two degeneration inductors are connected between respective sources of the input transistors of the at least two amplifier branches and a ground. The at least two degeneration inductors are configured to establish a magnetic coupling with the input inductor and establish another magnetic coupling between each other.

30 Claims, 8 Drawing Sheets

Related U.S. Application Data

(60) Provisional application No. 62/588,222, filed on Nov. 17, 2017.

(51) Int. Cl.
   H03F 3/195 (2006.01)
   H03F 1/56 (2006.01)
   H03F 1/22 (2006.01)

(58) Field of Classification Search
   USPC .............................. 330/278, 302, 311, 307
   See application file for complete search history.

(56) References Cited

U.S. PATENT DOCUMENTS

| | | |
|---|---|---|
| 8,229,367 B2 | 7/2012 | Chan et al. |
| 8,897,407 B2 | 11/2014 | Badke et al. |
| 9,712,195 B2 | 7/2017 | Wang et al. |
| 9,800,273 B1 | 10/2017 | Abdelhalem et al. |
| 10,038,418 B1 | 7/2018 | Ayranci et al. |
| 10,110,166 B1 | 10/2018 | Noori |
| 2011/0068871 A1 | 3/2011 | Fujimoto |
| 2013/0142295 A1 | 6/2013 | Badke et al. |
| 2014/0015614 A1 | 1/2014 | Oliveira et al. |
| 2019/0158042 A1 | 5/2019 | Abdelrazek et al. |
| 2019/0305740 A1 | 10/2019 | Medra et al. |

OTHER PUBLICATIONS

Fabiano I., et al., "SAW-Less Analog Front-End Receivers for TDD and FDD," IEEE Journal of Solid-State Circuits, Dec. 2013, vol. 48, No. 12, pp. 3067-3079.

Fu C-T., et al., "A 2.5GHz 32nm 0.35mm2 3.5dB NF-5dBm P1dB Fully Differential CMOS Push-Pull LNA with Integrated 34dBm T/R Switch and ESD Protection," IEEE International Solid-State Circuits Conference, ISSCC 2011, Feb. 21, 2011, pp. 56-57.

Joo T., et al., "A Fully Integrated RF CMOS Front-End IC for Connectivity Applications", IEEE Transactions on Circuit-and Systems—II: Express Briefs, vol. 63, No. 11, Nov. 2016, pp. 1024-1028.

Li X., et al., "Gm-Boosted Common-Gate LNA and Differential Colpitts VCO/QVCO in 0.18-um CMOS," IEEE Journal of Solid-State Circuits, vol. 40, No. 12, Dec. 2005, pp. 2609-2619.

Razavi B., "A Millimeter-Wave CMOS Heterodyne Receiver with On-Chip LO and Divider", in IEEE Journal of Solid-State Circuits, vol. 43, No. 2, Feb. 2008, pp. 477-485.

Reiha M.T., et al., "A 1.2 V Reactive-Feedback 3.1-10.6 GHz Low-Noise Amplifier in 0.13 μm CMOS", in IEEE Journal of Solid-State Circuits, vol. 42, No. 5, May 2007, pp. 1023-1033.

"International Search Report and Written Opinion", PCT Application No. PCT/US2019/058070, dated Mar. 12, 2020, 17 pages.

700 ─┐

```
┌─────────────────────────────────────────────┐
│   Generate a mutual inductance between      │
│   multiple degeneration inductors, the      │
│   multiple degeneration inductors           │
│   respectively connected between            │
│   multiple amplifier branches and a ground  │
│                     702                     │
└─────────────────────────────────────────────┘
                      │
                      ▼
┌─────────────────────────────────────────────┐
│ Generate another mutual inductance between  │
│ an input inductor and the multiple          │
│ degeneration inductors, at least a portion  │
│ of the input inductor connected between     │
│ the multiple amplifier branches and a       │
│ band-pass filter                            │
│                     704                     │
└─────────────────────────────────────────────┘
                      │
                      ▼
┌─────────────────────────────────────────────┐
│ Cause, based on the mutual inductance and   │
│ the other mutual inductance, an input       │
│ impedance of an amplifier to facilitate     │
│ passing of a communication signal from the  │
│ band-pass filter to the amplifier, the      │
│ amplifier including the multiple            │
│ degeneration inductors, the multiple        │
│ amplifier branches, and the input inductor  │
│                     706                     │
└─────────────────────────────────────────────┘
                      │
                      ▼
┌─────────────────────────────────────────────┐
│   Amplify the communication signal using    │
│   one or more of the multiple amplifier     │
│   branches                                  │
│                     708                     │
└─────────────────────────────────────────────┘
```

FIG. 7

GAIN-DEPENDENT IMPEDANCE MATCHING AND LINEARITY

CROSS-REFERENCE TO RELATED APPLICATION(S)

This application is a continuation-in-part of U.S. application Ser. No. 15/940,808, filed 29 Mar. 2018—the entire contents of which are herein incorporated by reference for all purposes, which claims the benefit of U.S. Provisional Application No. 62/588,222, filed 17 Nov. 2017—the entire contents of which are herein incorporated by reference for all purposes.

TECHNICAL FIELD

This disclosure relates generally to amplifiers and, more specifically, to having magnetically-coupled inductors that enhance impedance matching and linearity of low-noise amplifiers for different gains.

BACKGROUND

Electronic devices use radio-frequency (RF) signals to communicate information. These radio-frequency signals enable users to talk with friends, download information, share pictures, remotely control household devices, receive global positioning information, employ radar for detection and tracking, or listen to radio stations. As a distance over which these radio-frequency signals travel increases, it becomes increasingly challenging to distinguish the radio-frequency signals from background noise. To address this issue, electronic devices use low-noise amplifiers (LNAs), which amplify a radio-frequency signal without introducing significant additional noise. Performance of a low-noise amplifier depends on several factors, including impedance matching and linearity.

As electronic devices communicate over different distances, desired amounts of amplification by the low-noise amplifier can vary. Consider a mobile phone communicating with a base station. If the mobile phone is far from the base station, a strength of the radio-frequency signal may be low; thus, it may be desirable for the low-noise amplifier to provide more amplification. In contrast, if the mobile phone is close to the base station, the strength of the radio-frequency signal may be high; thus, it may be desirable for the low-noise amplifier to provide less amplification. It becomes challenging, however, to design a low-noise amplifier to support different amounts of amplification, which are referred to as different gain modes.

SUMMARY

An integrated circuit is disclosed that implements gain-dependent impedance matching and linearity. In particular, three or more magnetically-coupled inductors are integrated within a low-noise amplifier to adjust an input impedance and linearity of the low-noise amplifier according to a gain that the low-noise amplifier provides. By enabling the input impedance to change across different gain modes, the magnetically-coupled inductors can reduce losses and noise levels that are associated with the low-noise amplifier and thereby improve wireless communication performance.

In an example aspect, an integrated circuit is disclosed. The integrated circuit includes at least two amplifier branches, an input inductor, and at least two degeneration inductors. Each amplifier branch of the at least two amplifier branches includes a node, an input transistor, and a cascode stage. Respective nodes of the at least two amplifier branches are connected together. The input transistor has a gate, a source, and a drain. Respective gates of the input transistors of the at least two amplifier branches are connected together. The cascode stage is connected between the drain of the input transistor and the node. The input inductor is connected to the respective gates of the input transistors of the at least two amplifier branches. The at least two degeneration inductors are connected between respective sources of the input transistors of the at least two amplifier branches and a ground. The at least two degeneration inductors are configured to establish a magnetic coupling with the input inductor. The at least two degeneration inductors are also configured to establish another magnetic coupling between each other.

In an example aspect, an integrated circuit is disclosed. The integrated circuit includes an input terminal and at least two amplifier branches. The at least two amplifier branches include a first amplifier branch and a second amplifier branch. The first amplifier branch has a first node, a first input transistor, and a first cascode stage. The first input transistor has a first gate, a first source, and a first drain. The first gate is connected to the input terminal and the first source is connected to a ground. The first cascode stage is connected between the first drain and the first node. The second amplifier branch has a second node, a second input transistor, and a second cascode stage. The second input transistor has a second gate, a second source, and a second drain. The second gate is connected to the first gate and the second source is connected to the ground. The second cascode stage is connected between the second drain and the second node. The second node is connected to the first node. The integrated circuit also includes inductive means for magnetically coupling together the first gate, the second gate, the first source, and the second source. The inductive means is configured to produce, based on a first current that flows from the first source to the ground and a second current that flows from the second source to the ground, at least a portion of a third current that flows from the input terminal towards the first gate and the second gate.

In an example aspect, a method for gain-dependent impedance matching and linearity is disclosed. The method includes generating a mutual inductance between multiple degeneration inductors that are connected between multiple amplifier branches and a ground. The method also includes generating another mutual inductance between an input inductor and the multiple degeneration inductors. At least a portion of the input inductor is connected between the multiple amplifier branches and a band-pass filter. Based on the mutual inductance and the other mutual inductance, the method additionally includes causing an input impedance of an amplifier to facilitate passing of a communication signal from the band-pass filter to the amplifier. The amplifier includes the multiple degeneration inductors, the multiple amplifier branches, and the input inductor. The method further includes amplifying the communication signal using one or more of the multiple amplifier branches.

In an example aspect, an apparatus is disclosed. The apparatus includes at least two band-pass filters, at least one switch module, an amplifier circuit, an input inductor, and at least two degeneration inductors. The at least two band-pass filters have different passbands, and each band-pass filter of the at least two band-pass filters is configured to filter a received signal to produce a filtered signal. The at least one switch module is connected to the at least two band-pass filters and is configured to pass the filtered signal from a selected band-pass filter of the at least two band-pass filters. The amplifier circuit is connected to the at least one switch module. The amplifier circuit includes at least two amplifier branches. The amplifier circuit is configured to amplify the filtered signal that is passed by the at least one switch module using one or more of the at least two amplifier branches. The input inductor has an inductance and at least a portion of the input inductor is connected between the at least one switch module and the amplifier circuit. The at least two degeneration inductors have other inductances. The at least two degeneration inductors are respectively connected between the at least two amplifier branches of the amplifier circuit and a ground. The at least two degeneration inductors are magnetically coupled to each other and the input inductor with respective coupling coefficients. The input inductor and the at least two degeneration inductors are configured to cause an input impedance of the amplifier circuit, the input inductor, and the at least two degeneration inductors to be approximately equal to an output impedance of the selected band-pass filter based on the respective coupling coefficients, the inductance of the input inductor, and the other inductances of the at least two degeneration inductors.

BRIEF DESCRIPTION OF DRAWINGS

FIG. 3-1 illustrates an example implementation of a portion of the wireless transceiver for gain-dependent impedance matching and linearity.

FIG. 3-2 illustrates example connections between multiple switch modules and an input inductor for gain-dependent impedance matching and linearity.

FIG. 7 is a flow diagram illustrating an example process for gain-dependent impedance matching and linearity.

DETAILED DESCRIPTION

Electronic devices use low-noise amplifiers (LNAs) to support radio-frequency communication. As electronic devices communicate over different distances, desired amounts of amplification by a low-noise amplifier can vary for different gain modes. It becomes challenging, however, for the low-noise amplifier to achieve target impedance matching and linearity across the different gain modes. In particular, some techniques for achieving impedance matching and linearity at one gain mode may not be desirable for another gain mode. As such, performance of the low-noise amplifier may decrease across different gain modes, thereby decreasing the wireless communication performance of the electronic device.

To achieve a target input impedance, some low-noise amplifiers use external (e.g., off-chip) impedance-matching circuits, which increases a size of a radio-frequency front end (RFFE) module and the low-noise amplifier. The increased size is due to, for example, discrete electrical components, routing connections, connection bumps, and electrostatic discharge (ESD) protection circuits. Other techniques use two magnetically-coupled inductors implemented on the integrated circuit of the low-noise amplifier to achieve some measure of impedance matching and linearity. Both of these techniques, however, are unable to dynamically adjust the impedance matching and linearity according to different gains.

In contrast, example approaches are described herein for gain-dependent impedance matching and linearity. In particular, three or more magnetically-coupled inductors are implemented within the low-noise amplifier. As the low-noise amplifier provides different gains, an inductance provided by the magnetically-coupled inductors changes, thereby improving impedance matching and linearity across different gains of the low-noise amplifier.

Figure 1:
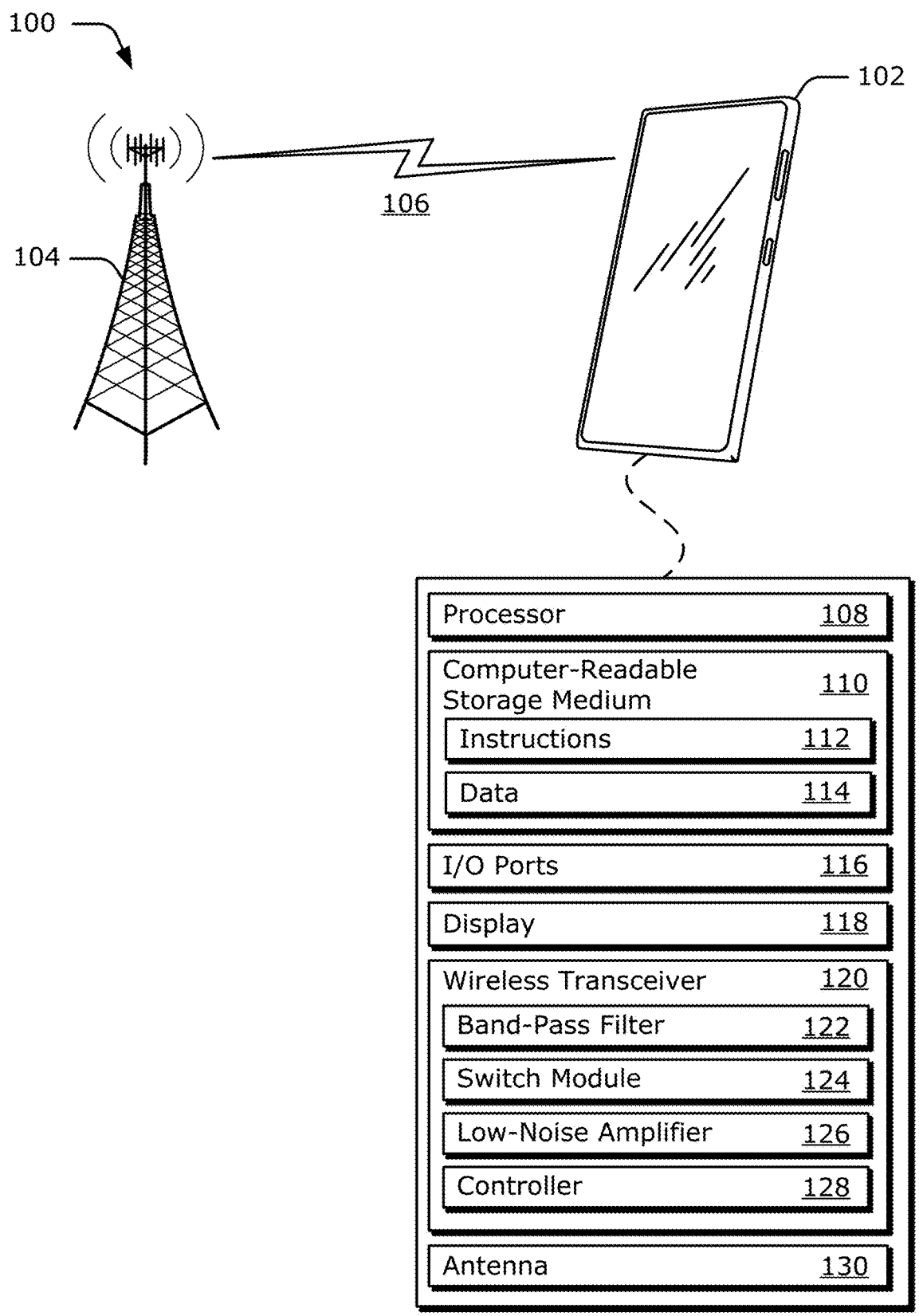
FIG. 1 illustrates an example environment for gain-dependent impedance matching and linearity.

FIG. 1 illustrates an example environment 100, which includes a computing device 102 that communicates with a base station 104 through a wireless communication link 106 (wireless link 106). In this example, the computing device 102 is implemented as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, Internet-of-Things (IoT) device, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, cable television head-end, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102 and an uplink of other data or control information communicated from the computing device 102 to the base station 104. The wireless link 106 may be implemented using any suitable communication protocol or standard, such as 3rd Generation Partnership Project Long-Term Evolution (3GPP LTE), 5th Generation (5G), IEEE 802.11, IEEE 802.16, Bluetooth™, and so forth.

As illustrated, the computing device 102 includes at least one processor 108 and at least one computer-readable storage medium 110 (CRM 110). The processor 108 may include any type of processor, such as an application processor or multi-core processor, that is configured to execute processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith.

The wireless transceiver 120 includes circuitry and logic, such as filters, switches, amplifiers, mixers, and so forth, for conditioning signals that are transmitted or received via at least one antenna 130. The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., separate receive and transmit chains). The wireless transceiver 120 also includes a baseband modem (not shown) to process data and/or signals associated with communicating data of the computing device 102 over the antenna 130. The baseband modem may be implemented as a system-on-chip (SoC) that provides a digital communication interface for data, voice, messaging, and other applications of the computing device 102. The baseband modem may also include baseband circuitry to perform high-rate sampling processes that can include analog-to-digital conversion, digital-to-analog conversion, gain correction, skew correction, frequency translation, and so forth.

As shown, the wireless transceiver includes at least one band-pass filter 122, at least one switch module 124, at least one low-noise amplifier (LNA) 126, and at least one controller 128. The band-pass filter 122 can be implemented with acoustic resonators, such as surface acoustic wave (SAW) resonators or bulk-acoustic wave (BAW) resonators. In some cases, the band-pass filter 122 can include multiple band-pass filters, which have different passbands (e.g., pass different frequency bands). The different passbands can be associated with one frequency band range or different frequency band ranges. Generally, each of the multiple band-pass filters can pass at least a portion of frequencies within a frequency band range associated with the passband. The band-pass filter 122 filters a signal that is received via the antenna 130 to produce a filtered signal.

The switch module 124 includes at least one switch that connects or disconnects the band-pass filter 122 to or from the low-noise amplifier 126. As used herein, the term "connect" or "connected" refers to an electrical connection, including a direct connection (e.g., connecting discrete circuit elements via a same node) or an indirect connection (e.g., connecting discrete circuit elements via one or more other devices or other discrete circuit elements). Assuming there are multiple band-pass filters 122, the switch module 124 can include multiple switches that respectively connect, one at a time, each of the multiple band-pass filters 122 to the low-noise amplifier 126. In general, the switch module 124 enables the filtered signal that is produced by the connected band-pass filter 122 to be received by the low-noise amplifier 126.

The low-noise amplifier 126, which is described with reference to FIGS. 2-6, can at least partially implement gain-dependent impedance matching and linearity. The low-noise amplifier 126 and the controller 128 are further described with respect to FIG. 2.

Figure 2:
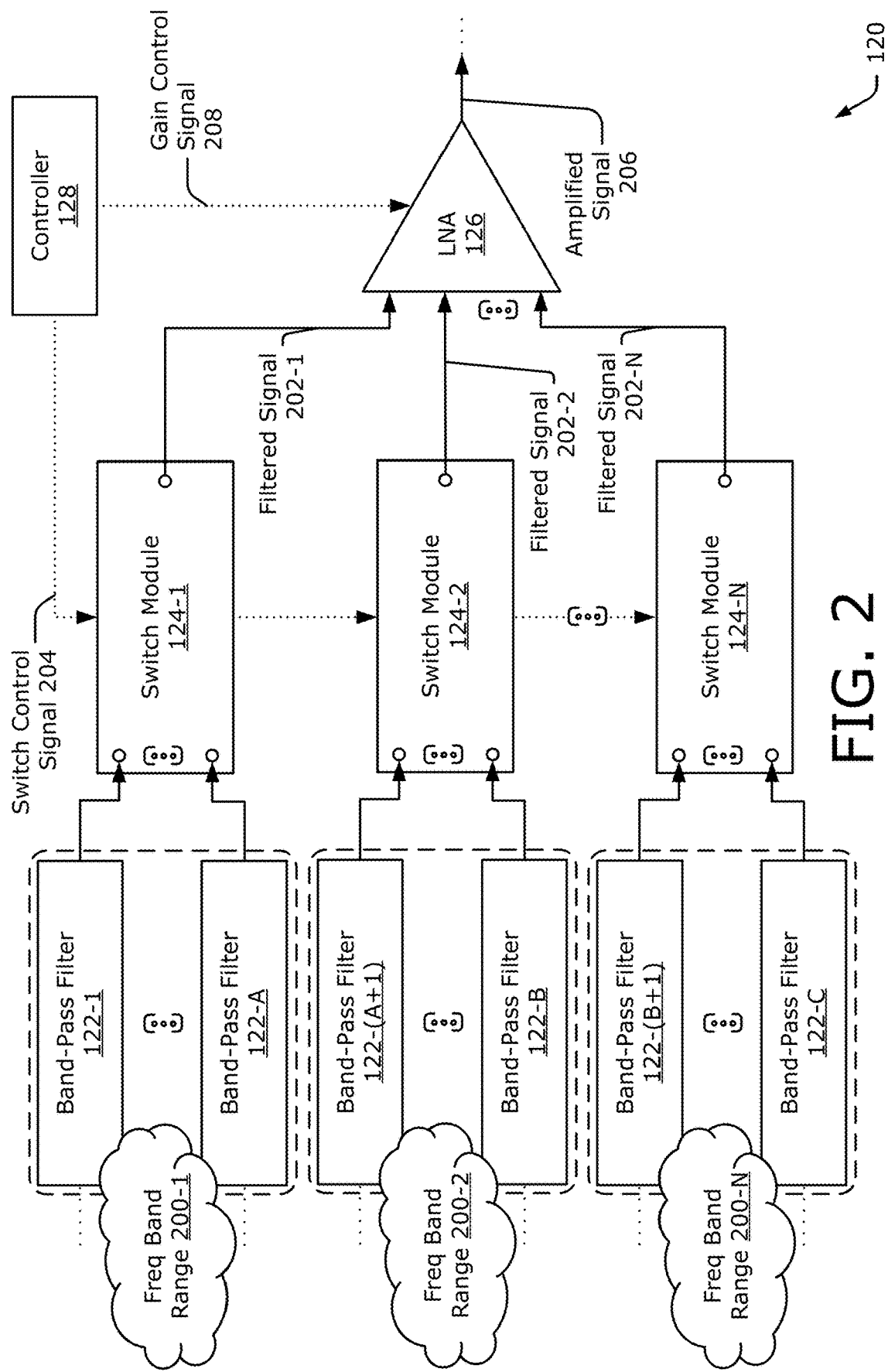
FIG. 2 illustrates a portion of an example wireless transceiver for gain-dependent impedance matching and linearity.

FIG. 2 illustrates a portion of the wireless transceiver 120 for gain-dependent impedance matching and linearity. In the depicted configuration, a receiver chain of the wireless transceiver 120 includes one or more band-pass filters 122-1 to 122-A associated with a frequency band range 200-1, one or more band-pass filters 122-(A+1) to 122-B associated with a frequency band range 200-2, and one or more band-pass filters 122-(B+1) to 122-C associated with a frequency band range 200-N. The receive chain also includes multiple switch modules 124-1, 124-2 . . . 124-N and the low-noise amplifier 126. In this example, A, B, C, and N represent positive integers. Thus, more or fewer than three switch modules or frequency bands can alternatively be implemented. The wireless transceiver 120 also includes the controller 128.

As shown in FIG. 2, each of the switch modules 124-1, 124-2, and 124-N is connected to a different group of band-pass filters associated with a different frequency band range 200-1, 200-2, and 200-N, respectively. Output nodes of the switch modules 124-1 to 124-N are connected to a different input node of the low-noise amplifier 126, as further described with respect to FIG. 3-2. In other implementations, the multiple switch modules 124-1 to 124-N can be implemented as a single switch module with multiple outputs. As an example, the multiple switch modules 124-1 to 124-N can be implemented with a multiplexer.

Each of the multiple band-pass filters 122-1 to 122-A, 122-(A+1) to 122-B, and 122-(B+1) to 122-C passes a different frequency band that is within the corresponding frequency band range 200-1 to 200-N. For example, each of the band pass filters 122-1 to 122-A can pass signals within one of the frequency bands 1, 3, or 66. These example frequency bands are within a middle frequency band range that includes frequencies between approximately 1.4 and 2.2 gigahertz (GHz). Likewise, each of the band-pass filters 122-(A+1) to 122-B can pass signals within one of the frequency bands 7, 30, 40, or 41, which are within a high frequency band range that includes frequencies between approximately 2.3 to 2.7 GHz. The band-pass filters 122 (B+1) to 122-C can each pass signals within one of the frequency bands 42, 43, or 48, which are within an ultra-high frequency band that includes frequencies between approximately 3.4 and 3.8 GHz. Although not shown, the band-pass filters 122-1 to 122-C can be connected to other components of the wireless transceiver 120, such as the antenna 130.

Together the switch modules 124-1 to 124-N select one of the multiple band-pass filters 122-1 to 122-C for providing a filtered signal 202-1 to 202-N to the low-noise amplifier 126. In other words, the switch modules 124-1 to 124-N connect one of the band-pass filters 122-1 to 122-C to the low-noise amplifier 126 at a time and disconnects the other band-pass filters. If selected band-pass filter is associated with the frequency band range 200-1, the switch module 124-1 passes the filtered signal 202-1 from the selected band-pass filter to the low-noise amplifier 126. Alternatively, if the selected band-pass filter is associated with the frequency band range 200-2 or 200-N, the switch modules 124-2 and 124-N respectively pass the filtered signal 202-2 or 202-N from the selected band-pass filter to the low-noise amplifier 126. In some cases, the switch modules 124-1 to 124-N can receive from the controller 128 a switch control signal 204, which specifies a configuration of multiple switches (not shown in FIG. 2) within the switch modules 124-1 to 124-N. In some aspects, the switch control signal 204 can comprise a multi-bit signal with each bit controlling a state of a switch within the multiple switch modules 124-1 to 124-N.

The low-noise amplifier 126 amplifies the filtered signal 202-1 to 202-N that is received from the selected band-pass filter of the band-pass filters 122-1 to 122-C to produce an amplified signal 206. In some cases, the low-noise amplifier 126 can receive from the controller 128 a gain control signal 208, which specifies a target amount of amplification of the filtered signal. An output of the low-noise amplifier 126 can be connected to other components of the wireless transceiver 120, such as other amplifiers or mixers, until a received signal is provided to a baseband modem (not shown) for further processing.

The controller 128 includes control circuitry to generate the switch control signal 204 and the gain control signal 208. The controller 128 can respectively route the switch control signal 204 and the gain control signal 208 to the switch modules 124-1 to 124-N and the low-noise amplifier 126 via a communication interface, such as a serial bus. In some aspects, the mobile industry processor interface (MIPI) radio-frequency front-end (RFFE) interface standard may be used for communicating these control signals. One or more registers may also be used to store and provide access to information that is carried by the switch control signal 204 or the gain control signal 208. The controller 128, for example, can write to the register upon startup or during operation of the wireless transceiver 120.

The controller 128 may also be responsible for setting an operational mode of the wireless transceiver 120. The operational mode can be associated with a communication frequency band the wireless transceiver 120 may receive or a gain mode of the wireless transceiver 120. In this way, the controller 128 can determine the appropriate information to convey in the switch control signal 204 or the gain control signal 208 based on the current operational mode. In other cases, the controller 128 may reference information that is stored in the computer-readable storage medium 110 for generating the switch control signal 204 or the gain control signal 208.

To specify the switch configuration of the switch modules 124-1 to 124-N, the controller 128 can determine a frequency band of a wireless communication signal that the wireless transceiver 120 may receive. For example, if the wireless communication signal is within a frequency band associated with a passband of the band-pass filter 122-1, the controller 128 can generate the switch control signal 204 to cause the switch module 124-1 to connect the band-pass filter 122-1 to the low-noise amplifier 126. The switch control signal 204 can also cause the switch modules 124-1 to 124-N to disconnect the other band-pass filters from the low-noise amplifier 126.

The controller 128 can determine a target amplification of the wireless communication signal or a target power mode of the computing device 102 for performing the wireless communication. This determination may be based on information provided by the processor 108, such as a measured distance between the base station 104 and the computing device 102, predetermined communication performance, available power of the computing device 102 (e.g., remaining battery power), and so forth. Accordingly, the controller 128 can use this information to specify a gain of the low-noise amplifier 126, as described in further detail with respect to FIG. 4. In some implementations, the switch modules 124-1 to 124-N and the low-noise amplifier 126 are implemented on a same integrated circuit, as shown in FIG. 3-1.

Figures 1, 3:
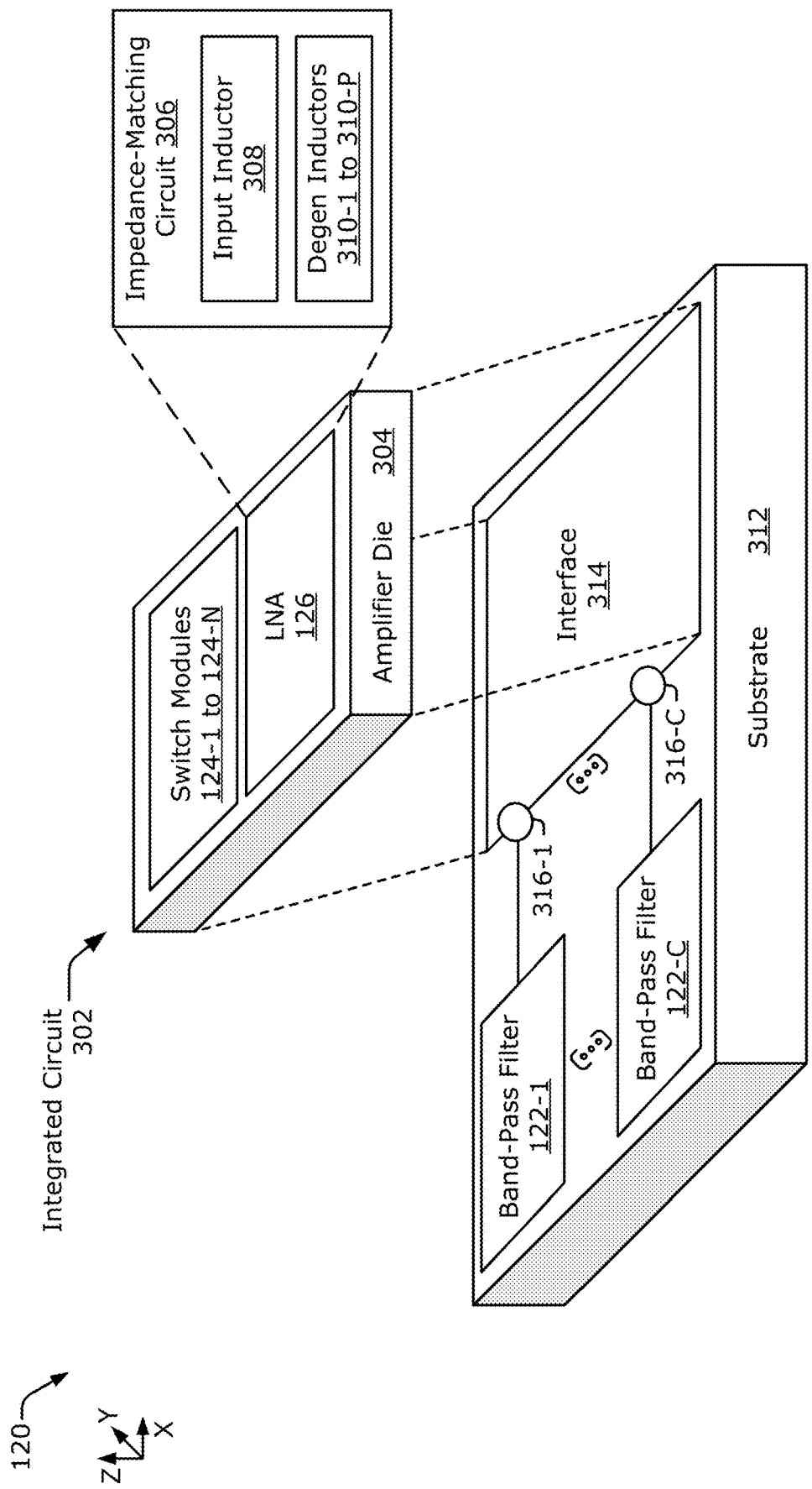
Figures 2, 3:
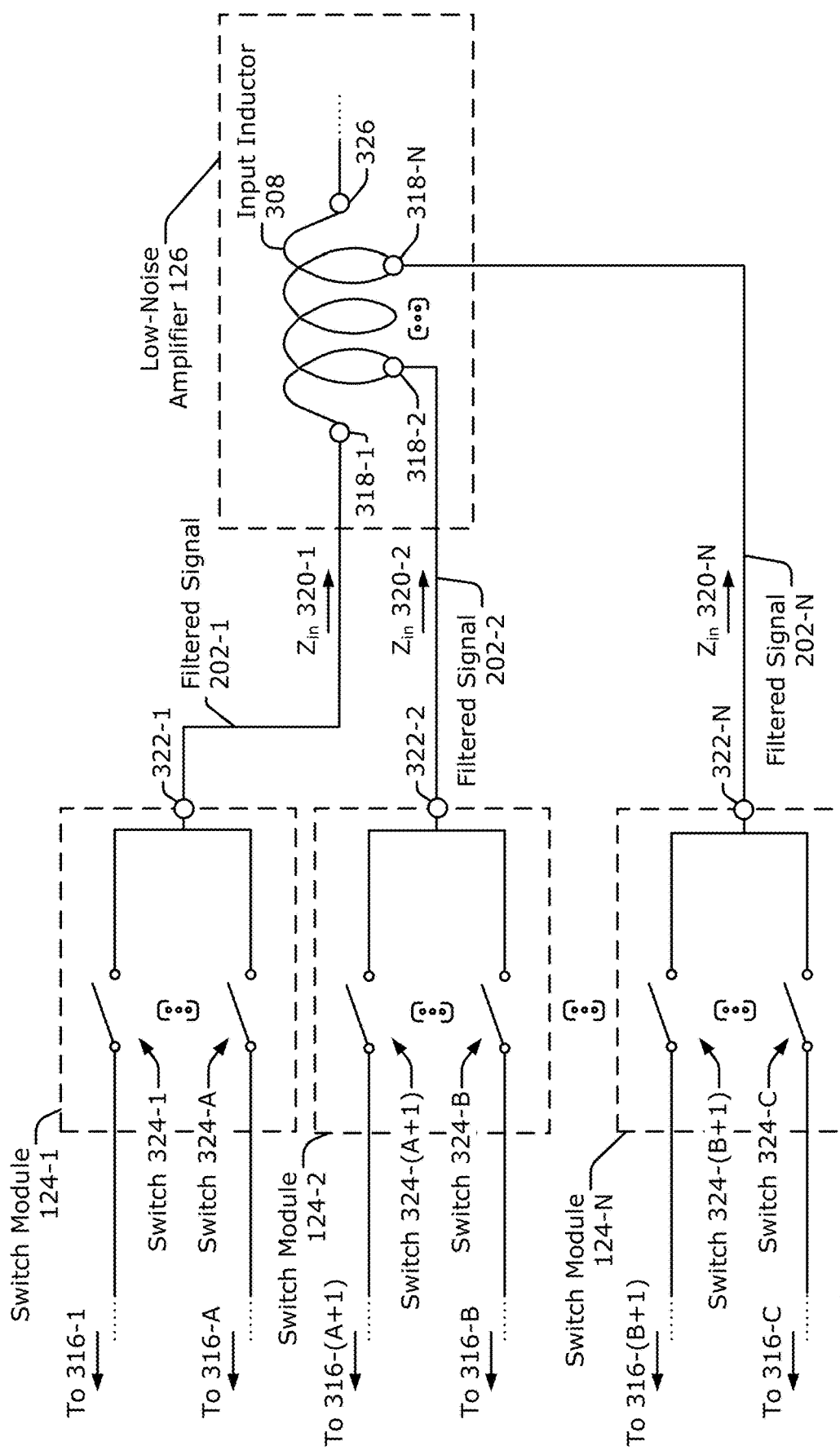

FIG. 3-1 illustrates an example implementation of the wireless transceiver 120 for gain-dependent impedance matching and linearity. The wireless transceiver 120 includes an integrated circuit 302 implemented on an amplifier die 304. The integrated circuit 302 includes the switch modules 124-1 to 124-N and the low-noise amplifier 126. The low-noise amplifier 126 also includes an impedance-matching circuit 306, which includes at least one input inductor 308 and at least two degeneration inductors 310-1 to 310-P, which are depicted individually in FIG. 4. The input inductor 308 and the degeneration inductors 310-1 to 310-P can be implemented on one or more metal layers of the integrated circuit 302. The input inductor 308 and the degeneration inductors 310-1 to 310-P are magnetically coupled together, as described in further detail with respect to FIG. 4.

Figure 5:
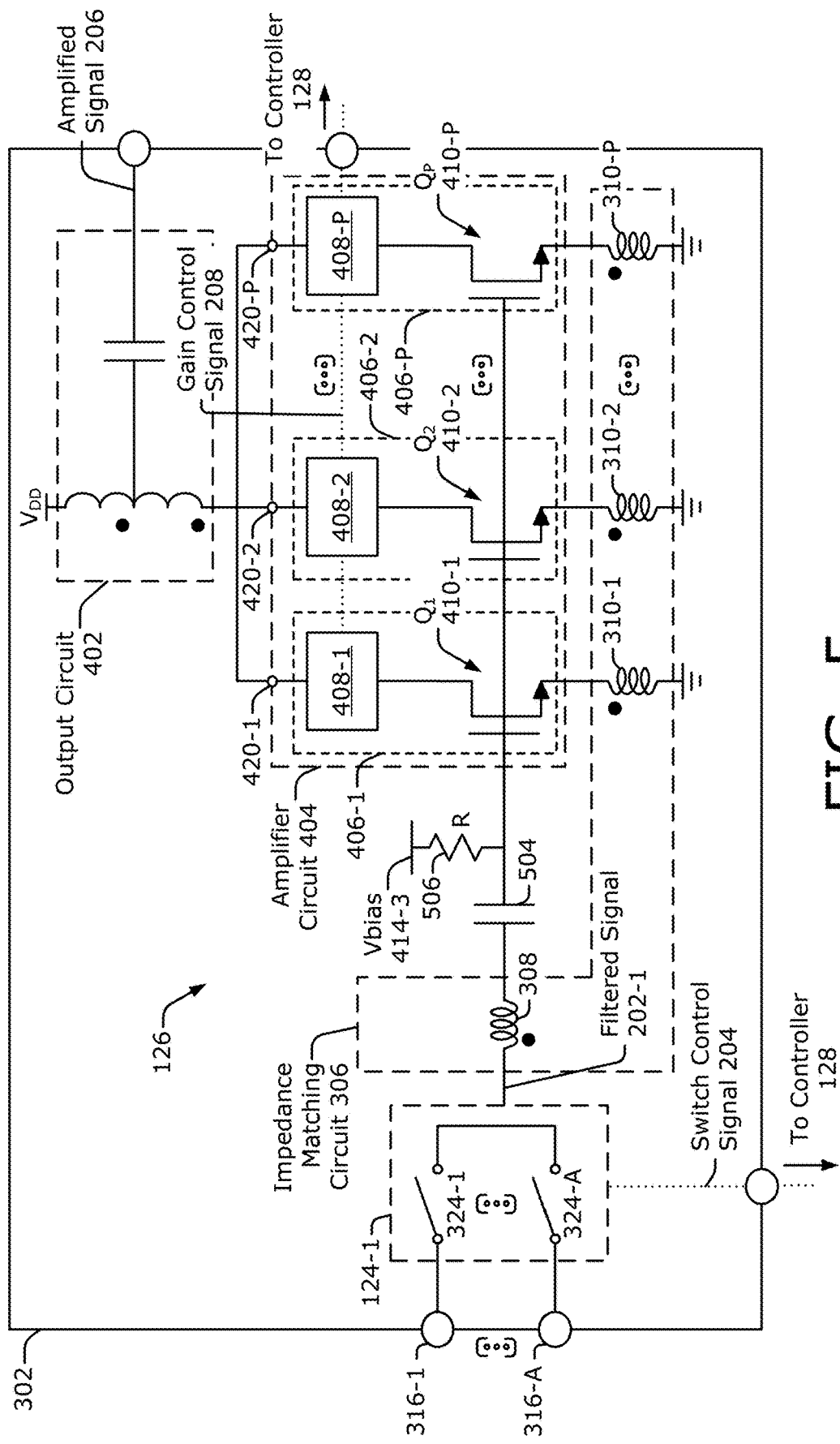
FIG. 5 illustrates an example integrated circuit for gain-dependent impedance matching and linearity.

The integrated circuit 302 can be mounted to a substrate 312, which includes an interface 314, multiple input terminals 316-1 to 316-C, and the multiple band-pass filters 122-1 to 122-C (of FIG. 2). As shown in FIG. 3-1, the multiple band-pass filters 122-1 to 122-C can be separate from the integrated circuit 302. The interface 314, which is disposed on a surface of the substrate 312, is configured to accept and connect to the amplifier die 304. The multiple input terminals 316-1 to 316-C respectively connect the multiple band-pass filters 122-1 to 122-C to one of the switch modules 124-1 to 124-N, as further shown in FIG. 3-2. Although C input terminals 316-1 to 316-C are explicitly shown to be respectively connected to the multiple band-pass filters 122-1 to 122-C, the interface 314 can include additional terminals. Additional terminals can be used, for example, to communicate the switch control signal 204 or the gain control signal 208 that is generated by the controller 128 or to provide the amplified signal 206 to other components of the wireless transceiver 120. Although not explicitly shown in FIG. 3-1, a matching set of input terminals 316-1 to 316-C can be implemented on the integrated circuit 302 as shown in FIG. 5. Connections between the switch modules 124-1 to 124-N and the input inductor 308 within the integrated circuit 302 are further described with respect to FIG. 3-2.

Figure 4:
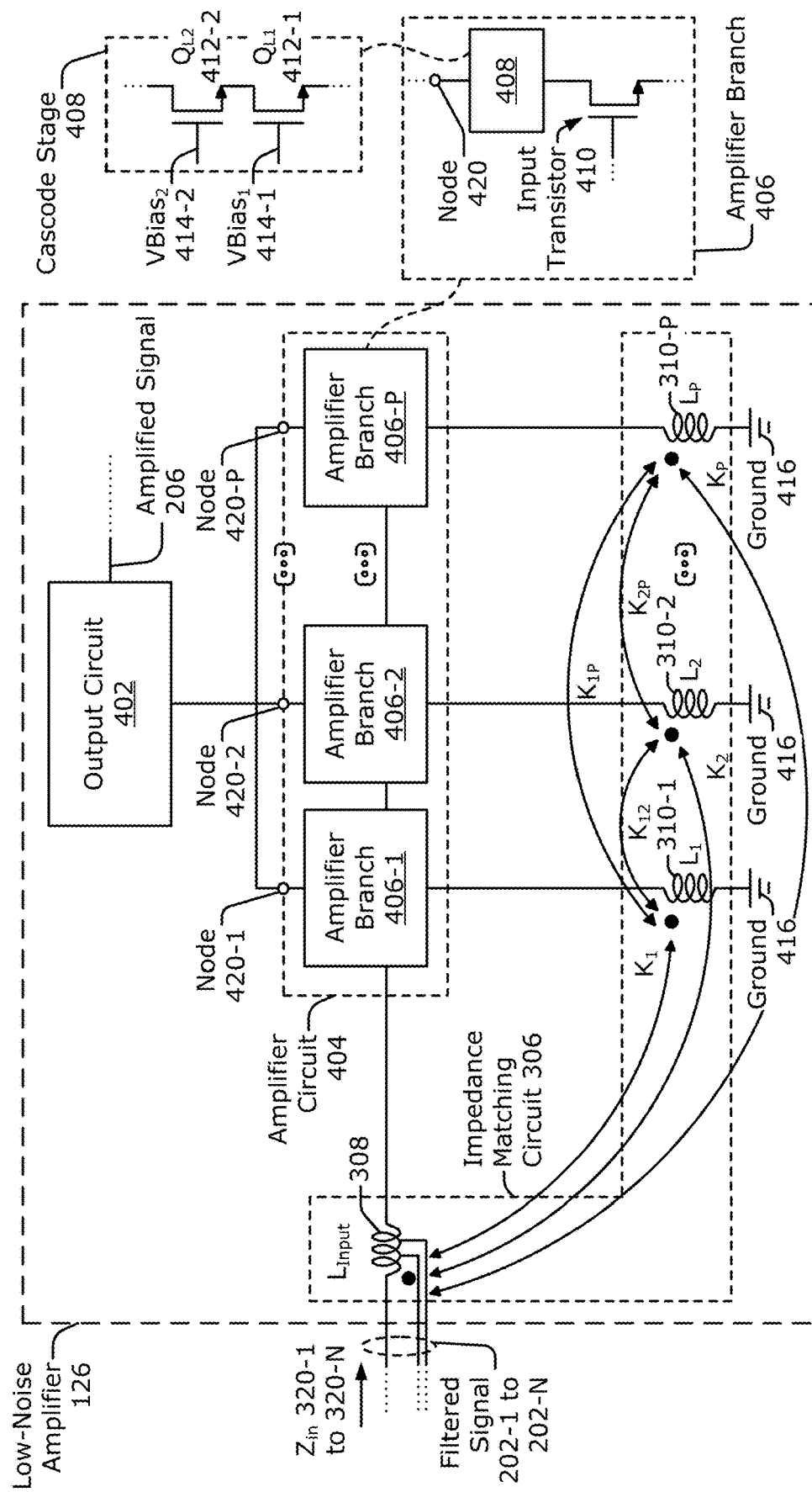
FIG. 4 illustrates an example low-noise amplifier for gain-dependent impedance matching and linearity.

FIG. 3-2 illustrates example connections between the switch modules 124-1 to 124-N and the input inductor 308 for gain-dependent impedance matching and linearity. In the depicted configuration, the input inductor 308 includes multiple input nodes 318-1, 318-2 . . . 318-N and an output node 326. The multiple input nodes 318-1 to 318-N can be different taps on the input inductor 308. The output node 326 can be connected to other components within the low-noise amplifier 126, as shown in FIGS. 4 and 5.

Consider, by way of example, that the input inductor 308 comprises a conductor that has at least one loop formed about a center axis. The loop represents a coil or winding of the input inductor 308 and can be shaped in the form of an oval or a polygon (e.g., a rectangle or an octagon). In some cases, the conductor can have a spiral shape with multiple loops curving in a gradually lengthening or shortening radius about the center axis. The multiple input nodes 318-1 to 318-N are connected to the conductor at different points along the one or more loops. As such, an effective length of the conductor differs as seen from each of the multiple input nodes 318-1 to 318-N to the output node 326.

Generally, the multiple input nodes 318-1 to 318-N are connected to or positioned at different locations along a length of the input inductor 308. Consequently, an input impedance of the low-noise amplifier 126 differs across the multiple input nodes 318-1 to 318-N. In this example, the low-noise amplifier 126 has input impedances (Zin) 320-1, 320-2, and 320-N at the input nodes 318-1, 318-2, and 318-N, respectively. An observed inductance of the input inductor 308 also differs across the multiple input nodes 318-1 to 318-N. The inductance of the input inductor 308 is based on a portion of the input inductor 308 that a signal accepted at the input node 318-1 to 318-N propagates through. In this case, the inductance of the input inductor 308 decreases across the input nodes 318-1 to 318-N such that a location of the input node 318-1 causes the input inductor 308 to present a relatively large inductance and a location of the input node 318-N causes the input inductor 308 to present a relatively small inductance.

Output nodes 322-1, 322-2, and 322-N of the switch modules 124-1, 124-2, and 124-N are respectively connected to the input nodes 318-1, 318-2, and 318-N. Each of the switch modules 124-1 to 124-N include at least one switch. For example, the switch module 124-1 includes switches 324-1 to 324-A, which are respectively connected to the band-pass filters 122-1 to 122-A of FIG. 2 via the input terminals 316-1 to 316-A. The switches 324-1 to 324-A are also connected to the input node 318-1 via the output node 322-1. Similarly, the switch module 124-2 includes switches 324-(A+1) to 324-B, which are respectively connected to the band-pass filters 122-(A+1) to 122-B of FIG. 2 via the input terminals 316-(A+1) to 316-B and are connected to the input node 318-2 via the output node 322-2. The switch module 124-N includes switches 324-(B+1) to 324-C, which are respectively connected to the band-pass filters 122-(B+1) to 122-C of FIG. 2 via the input terminals 316-(B+1) to 316-C and are connected to the input node 318-N via the output node 322-N.

In this manner, the switch modules 124-1 to 124-N can connect different band-pass filters 122-1 to 122-C associated with different frequency range bands 200-1 to 200-N to different input nodes 318-1 to 318-N of the input inductor 308 to cause the input inductor 308 to present different inductances and the low-noise amplifier 126 to therefore present different input impedances 320-1 to 320-N. As such, both the input impedance 320-1 to 320-N of the low-noise amplifier 126 and the inductance of the input inductor 308 can be increased for frequency band ranges 200-1 to 200-N that have lower frequencies relative to frequency band ranges 200-1 to 200-N that have higher frequencies. The variety of different input impedances 320-1 to 320-N and inductances of the input inductor 308 enable the low-noise amplifier 126 to provide gain-dependent impedance matching and linearity for filtered signals 202-1 to 202-N having substantially different frequencies (e.g., for filtered signals 202-1 to 202-N associated with different frequency band ranges 200-1 to 200-N), as further described with respect to FIG. 4.

FIG. 4 illustrates an example low-noise amplifier 126 for gain-dependent impedance matching and linearity. The low-noise amplifier 126 includes an output circuit 402, an amplifier circuit 404, and the impedance-matching circuit 306. The output circuit 402 may be connected to an output terminal (not shown). In addition to providing the amplified signal 206 at the output terminal, the output circuit 402 provides output impedance matching by transforming an output impedance of the low-noise amplifier 126 to a predetermined value, such as 50 ohms. The output circuit 402 can be implemented, for example, using a transformer, a choke, an autotransformer, and so forth. The low-noise amplifier 126 receives one of the filtered signal 202-1 to 202-N via one of the input nodes 318-1 to 318-N. The filtered signal 202-1 to 202-N passes through at least a portion of the input inductor 308 of the impedance-matching circuit 306 to the amplifier circuit 404 based on a location of the input node 318-1 to 318-N.

The amplifier circuit 404 includes at least two amplifier branches 406, which forms at least part of the low-noise amplifier 126. An amplifier branch 406 includes an input stage and a cascode stage 408. The input stage can be implemented using an input transistor 410, such as an n-channel metal-oxide semiconductor field-effect transistor (MOSFET) that is configured as a common-source amplifier. In the depicted configuration, the input transistor 410 has a gate connected to the input inductor 308, a source connected to one of the degeneration inductors 310, and a drain connected to the cascode stage 408.

The cascode stage 408 is connected between the drain of the input transistor 410 and the output circuit 402. The cascode stage 408 can be implemented using, for example, another amplifier that includes one or more other transistors. In some implementations, the cascode stage 408 includes multiple cascode stages. An example double cascode configuration includes a first cascode transistor $Q_{L1}$ 412-1 and a second cascode transistor $Q_{L2}$ 412-2, both of which are configured as common-gate amplifiers. Within each amplifier branch 406, the first cascode transistor 412-1 and the second cascode transistor 412-2 are connected in series with the input transistor 410. Assuming the cascode stage 408 is implemented using the double cascode configuration described above, the controller 128 (not shown) can adjust bias voltages 414, such as $VBias_1$ 414-1 and $VBias_2$ 414-2, via the gain control signal 208 for the first and second cascode transistors 412-1 and 412-2, respectively. Using the bias voltages 414, the controller 128 can enable or disable different combinations of the amplifier branches 406.

In the depicted configuration, the amplifier circuit 404 includes P amplifier branches 406-1 to 406-P. This includes a first amplifier branch 406-1, a second amplifier branch 406-2, and a Pth amplifier branch 406-P, with P representing a positive integer. Each amplifier branch 406-1 to 406-P includes a node 420, such as nodes 420-1, 420-2, and 420-P that are respectively associated with the amplifier branches 406-1, 406-2, and 406-P. The nodes 420-1 to 420-P of the amplifier branches 406-1 to 406-P are connected together and coupled to the output circuit 402. In this way, the amplifier branches 406-1 to 406-P are connected in parallel between the output circuit 402 and a ground 416.

By enabling or disabling different combinations of the amplifier branches 406-1 to 406-P, the controller 128 enables the amplifier circuit 404 to provide different gains. For example, the controller 128 may enable one of the amplifier branches 406-1 to 406-P for a lower gain mode or enable two or more of the amplifier branches 406-1 to 406-P for a higher gain mode. In general, higher gains are achieved by enabling more amplifier branches 406-1 to 406-P and lower gains are achieved by enabling fewer amplifier branches 406-1 to 406-P.

The impedance-matching circuit 306 includes the input inductor 308 having an inductance of $L_{Input}$, which can change depending on the input node 318-1 to 318-N. At least a portion of the input inductor 308 is connected between the selected band-pass filter 122 and the respective gates of the input transistors 410 of the amplifier branches 406-1 to 406-P. The impedance-matching circuit 306 also includes at least two degeneration inductors 310 connected between respective sources of the input transistors 410 of the amplifier branches 406-1 to 406-P and the ground 416. In the depicted configuration, P degeneration inductors 310-1 to 310-P are shown, including a first degeneration inductor 310-1, a second degeneration inductor 310-2, and a Pth degeneration inductor 310-P. Each of the degeneration inductors 310-1 to 310-P has an inductance, such as respective inductances $L_1$, $L_2$, and $L_P$ for the first degeneration inductor 310-1, the second degeneration inductor 310-2, and the Pth degeneration inductor 310-P. Generally, a quantity of degeneration inductors 310-1 to 310-P equals a quantity of amplifier branches 406-1 to 406-P; however, different numbers may be implemented. For example, one of the degeneration inductors 310-1 to 310-P can be connected to two or more of the amplifier branches 406-1 to 406-P.

The input inductor 308 and the degeneration inductors 310-1 to 310-P are magnetically coupled and generate a mutual inductance. As illustrated using the dot convention, a current that flows through one of the degeneration inductor 310-1 to 310-P from the source of an input transistor 410 to the ground 416 induces, via a generated magnetic field, a portion of another current in the input inductor 308 that flows from one of the input nodes 318-1 to 318-N of the input inductor 308 to an output node of the input inductor 308 that is connected to the amplifier circuit 404. Additionally, as shown with respect to Equation 1 below, this magnetic coupling enables a real-part of an input impedance 320-1 to 320-N of the low-noise amplifier 126 to be dependent upon a summation of the inductances of the degeneration inductors 310-1 to 310-P and a mutual inductance between the input inductor 308 and the degeneration inductors 310-1 to 310-P.

In addition to each of the degeneration inductors 310-1 to 310-P being magnetically coupled to the input inductor 308 (represented by coupling coefficients $K_1$, $K_2$, and $K_P$), the degeneration inductors 310-1 to 310-P are also magnetically coupled with each other (represented by coupling coefficients $K_{12}$, $K_{1P}$, and $K_{2P}$). As shown using the dot-convention, a first current that flows through the first degeneration inductor 310-1 from the source of the input transistor 410 to the ground 416 induces a portion of a second current in the second degeneration inductor 310-2 that flows from the source of another input transistor 410 of the second amplifier branch 406-2 to the ground.

The impedance-matching circuit 306 is used to adjust the input impedances 320-1 to 320-N of the low-noise amplifier 126 to a predetermined value, such as 50 ohms. The resulting real-part of the input impedance 320-1 to 320-N (Re (Zin)) of the low-noise amplifier 126 is approximated by Equation 1 below.

$$\mathrm{Re}(Zin) = \frac{\sum_{i=1}^{P} G_{mi}}{\sum_{i=1}^{P} C_{gsi}} \left( L_T + \frac{K}{n} L_{Input} \right) \quad \text{Equation 1}$$

where i represents individual amplifier branches 406, $G_{mi}$ is the transconductance for the ith amplifier branch 406, $C_{gsi}$ is the capacitance seen from the gate to the source of the ith input transistor 410, and K is a coupling coefficient that has a value between zero and one. In this case, $K=K_1=K_2=K_P$ for simplicity. Although the coupling coefficients between the input inductor 308 and respective degeneration inductors 31001 to 310-P are shown to be similar in the above equation for simplicity, the values of the coupling coefficients can be respectively different. As mentioned above, $L_{Input}$ represents the inductance of the input inductor 308, which can change depending on which input node 318-1 to 318-N accepts the filtered signal 202-1 to 202-N. The total inductance of the degeneration inductors 310-1 to 310-P (e.g., the total degeneration inductance) is represented by $L_T$, which is shown by Equation 2 below.

$$L_T = (L_1 + M_{12} + \ldots + M_{1P}) \| (L_2 + M_{21} + \ldots + M_{2P}) \| \ldots \| (L_P + M_{P1} + \ldots + M_{P(P-1)}) \quad \text{Equation 2}$$

where $M_{ij}$ is the mutual inductance between the ith degeneration inductor 310 and the jth degeneration inductor 310. In Equation 1, n is related to the inductances of the input inductor 308 and the degeneration inductors 310-1 to 310-P, as shown by Equation 3 below.

$$n = \sqrt{\frac{L_{Input}}{L_T}} \quad \text{Equation 3}$$

As seen in Equation 1 above, a predetermined value of the input impedance can be achieved from the inductances of the input inductor 308 and the degeneration inductors 310-1 to 310-P as well as the coupling coefficients. Accordingly, the impedance-matching circuit 306 provides a portion of the input impedance 320-1 to 320-N for the low-noise amplifier 126 such that the input impedance 320-1 to 320-N substantially matches an output impedance of a connected band-pass filter 122-1 to 122-C (of FIG. 2). For example, the input impedance 320-1 to 320-N of the low-noise amplifier 126 may be substantially conjugately matched to the output impedance of the band-pass filter 122-1 to 122-C such that a reflection coefficient at the input terminal 316-1 to 316-C (e.g., scattering parameter S11) is less than negative ten decibels.

The use of multiple degeneration inductors 310-1 to 310-P improves input impedance matching for different gain modes. At a lower gain mode, the controller 128 may, for example, enable the first amplifier branch 406-1 and disable the other amplifier branches (e.g., 406-2 to 406-P). This enables a current to flow through the first amplifier branch 406-1 and the first degeneration inductor 310-1 and substantially prevents other currents from flowing through the other amplifier branches (e.g., 406-2 to 406-P) and the other degeneration inductors (e.g., 310-2 to 310-P). Because the degeneration inductors 310-1 to 310-P are effectively connected in parallel between the ground 416 and the output circuit 402, disabling one or more of the parallel paths via the amplifier branches 406-2 to 406-P causes the total degeneration inductance to increase from a parallel combination of the multiple degeneration inductors 310-1 to 310-P to the inductance of the first degeneration inductor 310-1. Thus, in Equation 1, the transconductance summation decreases (e.g., $G_{m1}+G_{m2}+\ldots+G_{mp} \rightarrow G_{m1}$) and the total degeneration inductance increases (e.g., $L_T=L_1$). The resulting increase in $L_T$ compensates for at least a portion of the decrease in the transconductance summation, thereby improving input impedance matching for lower gain modes.

Due to this compensation, similar impedance matching performance can be realized for different gains. As an example, if the gain of the low-noise amplifier 126 changes by approximately six decibels, the reflection coefficient at the connected input terminal 316-1 to 316-C may change by less than one decibel. As another example, if the gain of the low-noise amplifier 126 changes by approximately twelve decibels, the reflection coefficient at the connected input terminal 316-1 to 316-C may change by less than three decibels. In this way, the low-noise amplifier 126 can maintain similar input impedance matching performance across a variety of different gains.

The multiple degeneration inductors 310-1 to 310-P also improve linearity for lower gain modes. In general, transconductance changes based on the filtered signal 202-1 to 202-N, which contributes to a portion of non-linearity in the amplifier circuit 404. In contrast, the degeneration inductances ($L_1$, $L_2$, and $L_P$) do not depend on the filtered signal 202-1 to 202-N. As transconductance decreases and the total degeneration inductance increases, a gain of the low-noise amplifier 126 becomes more dependent upon the total degeneration inductance than the transconductance. Consequently, the gain depends less on the filtered signal 202-1 to 202-N, which increases linearity of the low-noise amplifier 126 for lower gain modes. The linearity can improve for lower gain modes, for example, by approximately four decibels or more, as compared to other low-noise amplifiers 126 that have a single degeneration inductor 310.

The input impedance matching provided by the impedance-matching circuit 306 also accommodates for wideband operation, meaning that input impedance matching can be provided across a wide range of frequencies (across one or more of the frequency band ranges 200-1 to 200-N). In some implementations of the amplifier circuit 404, at least one tuning capacitor (not shown) can be connected between the gate and the source of one or more of the input transistors 410. This tuning capacitor can be implemented as a programmable capacitor with an adjustable capacitance that can be used to further adjust the input impedance 418 for different frequency bands. With respect to Equation 1, the tuning capacitor adds an additional capacitance to the gate-to-source capacitance. However, due to the wideband input impedance-matching performance of the impedance-matching circuit 306, the tuning capacitor becomes optional and can be removed to further save space on the integrated circuit 302.

The impedance-matching circuit 306 can also set an imaginary-part of the input impedance 320-1 to 320-M (Im(Zin)) of the low-noise amplifier 126 to achieve a target input matching and noise figure performance, as shown in Equation 4 below.

$$\mathrm{Im}(Zin) = \omega \left( L_T(1 + K \cdot n) + L_{Input}\left(1 + \frac{K}{n}\right) - \frac{1}{\omega^2 \sum\limits_{i=1}^{P} C_{gsi}} \right) \quad \text{Equation 4}$$

where ω represents an angular frequency.

As seen in Equation 4, the inductances of the input inductor 308 and the degeneration inductors 310-1 to 310-P, as well as the coupling coefficients, can be determined to achieve a target value of the imaginary part of the input impedance 320-1 to 320-N. In some implementations, the impedance-matching circuit 306 can set the input impedance 320-1 to 320-N to a value that is desirable for both input impedance matching and noise matching.

Compared to off-chip matching circuits, the impedance-matching circuit 306 is implemented on the integrated circuit 302, which saves space on the integrated circuit 302 and can enable a size of the integrated circuit 302 to be decreased. The space saving occurs because bumps and electro-static discharge (ESD) protection circuits are no longer needed on the integrated circuit 302 and can be removed. The ESD protection circuits can also add significant capacitance between the input terminals 316-1 to 316-C and the ground 416. Removing the ESD protection circuits can therefore improve the noise figure of the amplifier circuit 404. Furthermore, the impedance-matching circuit 306 can have finer resolution than discrete components that are used for external impedance matching. This provides additional flexibility and control for optimizing the impedance matching and noise figure performance during the design phase.

FIG. 5 illustrates an example integrated circuit 302 for gain-dependent impedance matching and linearity. The integrated circuit 302 includes the switch modules 124-1 and the low-noise amplifier 126. Other implementations can include more than one switch module 124. The switch module 124-1 includes multiple switches 324-1 to 324-A, which are respectively connected between the multiple input terminals 316-1 to 316-A and the impedance-matching circuit 306. The switch module 124-1 connects, via the multiple switches 324-1 to 324-A, one of multiple input terminals 316-1 to 316-A at a time to the impedance-matching circuit 306. The switch module 124-1 can receive the switch control signal 204 from the controller 128 to determine a configuration of the multiple switches 324-1 to 324-A. For example, the switch module 124-1 can close, based on the switch control signal 204, a first switch 324-1 to connect the first input terminal 316-1 to the impedance-matching circuit 306. As described above with respect to FIG. 3-2, the switch module 124-1 provides, to the low-noise amplifier 126, the filtered signal 202-1 from one of the band-pass filters 122-1 to 122-A via one of the multiple input terminals 316-1 to 316-A.

The low-noise amplifier 126 includes the output circuit 402, which is implemented using an autotransformer in FIG. 5. The output circuit 402 provides the amplified signal 206 that is generated via the amplifier circuit 404 to other components of the wireless transceiver 120. Additionally, the low-noise amplifier 126 includes a decoupling capacitor 504 connected between the input inductor 308 and the amplifier circuit 404. Furthermore, a bias resistor 506 having a resistance R can be connected between another bias voltage 414-3 (VBias 414-3) and a node located between the decoupling capacitor 504 and the amplifier circuit 404. The other bias voltage 414-3 may be different than the bias voltages applied to the cascode stages 408 (e.g., bias voltages 414-1 and 414-2 in FIG. 4).

In the depicted configuration, the amplifier circuit 404 includes the amplifier branches 406-1 to 406-P (of FIG. 4). The first amplifier branch 406-1 includes a first input transistor $Q_1$ 410-1 and a first cascode stage 408-1, the second amplifier branch 406-2 includes a second input transistor $Q_2$ 410-2 and a second cascode stage 408-2, and a Pth amplifier branch 406-P includes a Pth input transistor $Q_P$ 410-P and a Pth cascode stage 408-P. By enabling or disabling different combinations of the amplifier branches 406-1 to 406-P via the gain control signal 208, the controller 128 enables the amplifier circuit 404 to provide different gains. For example, the controller 128 may enable one of the amplifier branches 406-1 to 406-P for a lower gain mode or enable two or more of the amplifier branches 406-1 to 406-P for a higher gain mode.

In example implementations, both the input inductor 308 and the degeneration inductors 310-1 to 310-P are implemented on the integrated circuit 302. In general, the input inductor 308 and the degeneration inductors 310-1 to 310-P can have parallel center axes along a z-axis that is perpendicular to a plane that contains the one or more respective coils of each inductor. To achieve a target amount of mutual inductance, the input inductor 308 and the degeneration inductors 310-1 to 310-P can be implemented in a variety of ways to enable a magnetic flux caused by current flowing through one of the inductors to induce a portion of a current in one or more other inductors. The input inductor 308 and the degeneration inductors 310-1 to 310-P can be implemented on one or more different metal layers such that a portion of one of the degeneration inductors 310-1 to 310-P overlaps another portion of the input inductor 308 along the center axis, as described in further detail with respect to FIG. 6.

Figure 6:
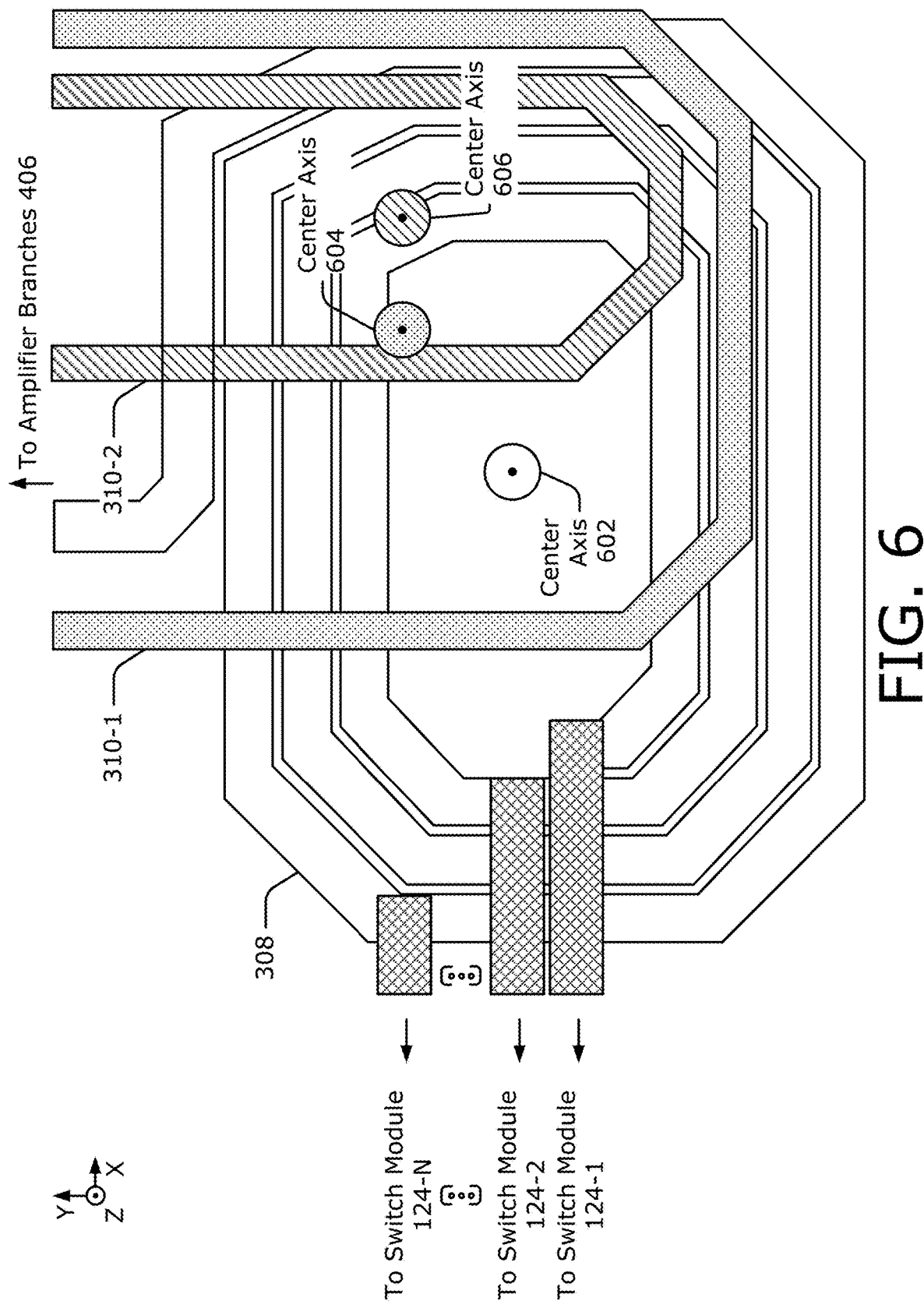
FIG. 6 illustrates example inductors for implementing gain-dependent impedance matching and linearity.

FIG. 6 illustrates example inductors for gain-dependent impedance matching and linearity. In the depicted configuration, different locations along the input inductor 308 are connected to different switch modules 124-1 to 124-N via the different input nodes 318-1 to 318-N shown in FIG. 3-2. In this example, the input inductor 308 and the degeneration inductors 310-1 and 310-2 are implemented on different metal layers of the integrated circuit 302. The different layers are illustrated using different patterns. The input inductor 308, the first degeneration inductor 310-1, and the second degeneration inductor 310-2 have one or more coils wrapped around respective center axes, as shown by center axis 602, center axis 604, and center axis 606, respectively. Each of the center axes is parallel to a z-axis that extends into and out of the page (e.g., perpendicular to the page). By controlling a position and orientation of the inductors, the coupling coefficients between the input inductor 308, the first degeneration inductor 310-1, and the second degeneration inductor 310-2 can be precisely set to provide the predetermined impedance matching. Additionally, the on-chip implementation of these inductors can decrease cost and conserve space on the integrated circuit 302. Although two degeneration inductors 310-1 and 310-2 are explicitly depicted in FIG. 6, more than two may be implemented. Furthermore, although the input inductor 308 and the degeneration inductors 310-1 and 310-2 are shown to be on separate metal layers, two or more of these inductors can be implemented on a same metal layer. For example, the input inductor 308 and the degeneration inductors 310-1 can be implemented in a same metal layer such that the input inductor 308 and the degeneration inductor 310-1 are side-by-side along an axis that is perpendicular to the center axis or such that one or more of the degeneration inductors 310-1 to 310-P are disposed inside the input inductor 308. In some implementations, the input inductor 308 and the one or more of the degeneration inductors 310-1 to 310-P are concentric with respect to each other and share a same center axis.

FIG. 7 is a flow diagram illustrating an example process 700 for gain-dependent impedance matching and linearity. The process 700 is described in the form of a set of blocks 702-708 that specify operations that can be performed. However, operations are not necessarily limited to the order shown in FIG. 7 or described herein, for the operations may be implemented in alternative orders or in fully or partially overlapping manners. Operations represented by the illustrated blocks of the process 700 may be performed a low-noise amplifier 126 (e.g., of FIGS. 1-5). More specifically, the operations of the process 700 may be performed by the input inductor 308 and the degeneration inductors 310-1 to 310-N as shown in FIGS. 3-6 in conjunction with the amplifier branches 406-1 to 406-P in FIGS. 4 and 5.

At block 702, a mutual inductance between multiple degeneration inductors is generated. The multiple degeneration inductors are respectively connected between multiple amplifier branches and a ground. For example, the multiple degeneration inductors 310-1 to 310-P in FIG. 4 can be magnetically coupled to each other to generate the mutual inductance via the coupling coefficients $K_{12}$, $K_{2P}$, and $K_{1P}$. The multiple degeneration inductors 310-1 to 310-P can be implemented on a same metal layer or different metal layers of the integrated circuit 302. The multiple degeneration inductors 310-1 to 310-P are connected between the amplifier branches 406-1 to 406-P and the ground 416. As shown via the dot convention of FIGS. 4 and 5, the magnetic flux caused by a current that flows through the first degeneration inductor 310-1 from the first amplifier branch 406-1 to the ground 416 induces a portion of other currents in the second degeneration inductor 310-2 and the Pth degeneration inductor 310-P that respectively flow from the second amplifier branch 406-2 to the ground 416 or from the Pth amplifier branch 406-P to the ground 416.

In general, each amplifier branch 406-1 to 406-P is connected between the output circuit 402 and the ground 416 via one of the parallel branches that includes one of the degeneration inductors 310-1 to 310-P. In some cases, each amplifier branch 406-1 to 406-P is connected to different degeneration inductors 310-1 to 310-P, as shown in FIGS. 4 and 5. In other cases, one or more of the amplifier branches 406-1 to 406-P are connected to a same degeneration inductor 310. While three degeneration inductors 310 and three amplifier branches 406 are explicitly depicted in FIGS. 4 and 5, any number of degeneration inductors 310 and amplifier branches 406 that is greater than or equal to two can be used.

At block 704, another mutual inductance between an input inductor and the multiple degeneration inductors is generated. At least a portion of the input inductor is connected between the multiple amplifier branches and a band-pass filter. For example, the input inductor 308 in FIG. 4 can be magnetically coupled to each of the multiple degeneration inductors 310-1 to 310-P via the coupling coefficients $K_1$, $K_2$, and $K_P$. The input inductor 308 can be implemented on a same metal layer or a different metal layer of the integrated circuit 302 as the multiple degeneration inductors 310.

At least a portion of the input inductor 308 can be connected between the amplifier circuit 404 and the band-pass filters 122. For example, the input inductor 308 can have one of the input nodes 318-1 to 318-N connected to one of the band-pass filters 122-1 to 122-C via one of the switch modules 124-1 to 124-N. The output node 326 of the input inductor 308 can be connected to respective gates of the input transistors 410 of the amplifier branches 406. As shown via the dot convention in FIGS. 4 and 5, the magnetic flux caused by the current that flows through the degeneration inductors 310-1 to 310-P from the amplifier branches 406-1 to 406-P to the ground 416 induces a portion of a current that flows through at least a portion of the input inductor 308 from the input node 318-1 to 318-N to the output node.

At block 706, an input impedance of an amplifier causes the passing of a communication signal from the band-pass filter to the amplifier to be facilitated based on the mutual inductance and the other mutual inductance. The amplifier includes the multiple degeneration inductors, the multiple amplifier branches, and the input inductor. For example, the mutual inductance between the multiple degeneration inductors 310-1 to 310-P and the other mutual inductance between the input inductor 308 and the multiple degeneration inductors 310-1 to 310-P can contribute to a portion of the real and the imaginary part of the input impedance 320-1 to 320-N of the low-noise amplifier 126, as shown in Equations 1 and 4 via K, n, $L_T$, and $L_{Input}$. In this way, the input inductor 308 and the multiple degeneration inductors 310-1 to 310-P can enable the low-noise amplifier 126 to achieve a predetermined input impedance 320-1 to 320-N that approximately matches an output impedance of a selected one of the band-pass filter 122-1 to 122-C and/or achieves a target noise figure for the low-noise amplifier 126. This can facilitate propagation of the filtered signal 202-1 to 202-N from the band-pass filter 122-1 to 122-C to the low-noise amplifier 126 (e.g., by reducing losses or noise), thereby improving communication performance of the computing device 102.

At block 708, the communication signal is amplified using the one or more of the multiple amplifier branches. For example, the amplifier branches 406-1 to 406-P can amplify the filtered signal 202-1 to 202-N to produce the amplified signal 206. Based on the gain control signal 208, different amplifications of the filtered signal 202-1 to 202-N can be achieved by enabling or disabling different combinations of the amplifier branches 406-1 to 406-P.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:
   a first input terminal configured to connect to a first band-pass filter having a first passband;
   a second input terminal configured to connect to a second band-pass filter having a second passband, the first passband and the second passband associated with different frequency band ranges;
   at least two amplifier branches, each amplifier branch of the at least two amplifier branches including:
      a node, respective nodes of the at least two amplifier branches connected together;
      an input transistor having a gate, a source, and a drain; respective gates of the input transistors of the at least two amplifier branches connected together; and
      a cascode stage connected between the drain of the input transistor and the node;
   an input inductor having a first input node, a second input node, and an output node; the first input node coupled to the first input terminal, the second input node coupled to the second input terminal, the output node connected to the respective gates of the input transistors of the at least two amplifier branches, the input inductor configured to:
      provide a first inductance between the first input node and the output node: and
      provide a second inductance between the second input node and the output node, the second inductance being different from the first inductance; and
   at least two degeneration inductors connected between respective sources of the input transistors of the at least two amplifier branches and a ground, the at least two degeneration inductors configured to:
      establish a magnetic coupling with the input inductor; and
      establish another magnetic coupling between each other.

2. The integrated circuit of claim 1, wherein:
   the at least two amplifier branches include a first input transistor and a second input transistor, the first input transistor having a first gate and a first source, the second input transistor having a second gate and a second source;
   the output node of the input inductor is connected to the first gate of the first input transistor and the second gate of the second input transistor; and
   the at least two degeneration inductors include a first degeneration inductor and a second degeneration inductor, the first degeneration inductor connected between the first source of the first input transistor and the ground, the second degeneration inductor connected between the second source of the second input transistor and the ground.

3. The integrated circuit of claim 2, wherein:
   the magnetic coupling between the input inductor and the at least two degeneration inductors is configured to induce, based on a first current that flows through the first degeneration inductor from the first source of the first input transistor to the ground or a second current that flows through the second degeneration inductor from the second source of the second input transistor to the ground, a portion of another current that flows through the input inductor from the first input node or the second input node to the output node; and
   the other magnetic coupling between the first degeneration inductor and the second degeneration inductor is configured to induce, based on the first current that flows through the first degeneration inductor from the first source of the first input transistor to the ground, a portion of the second current that flows through the second degeneration inductor from the second source of the second input transistor to the ground.

4. The integrated circuit of claim 3, wherein:
   the at least two amplifier branches, the input inductor, and the at least two degeneration inductors comprise a low-noise amplifier; and
   the input inductor and the at least two degeneration inductors are together configured to match an input impedance of the low-noise amplifier to an output impedance of the first band-pass filter or the second band-pass filter.

5. The integrated circuit of claim 4, wherein the input impedance of the low-noise amplifier is based on the first inductance of the input inductor or the second inductance of the input inductor, a total inductance of the at least two degeneration inductors, and coupling coefficients between the input inductor and the at least two degeneration inductors.

6. The integrated circuit of claim 5, wherein
   the at least two amplifier branches are configured to receive at least one gain control signal that controls different combinations of the first current through the first degeneration inductor and the second current through the second degeneration inductor; and the total inductance of the at least two degeneration inductors is configured to cause the input impedance of the low-noise amplifier to be substantially similar for the different combinations of the first current and the second current.

7. The integrated circuit of claim 1, further comprising:
at least one switch module coupled to the first input terminal, the second input terminal, the first input node of the input inductor, and the second input node of the input inductor.

8. The integrated circuit of claim 7, further comprising:
a third input terminal configured to connect to a third band-pass filter having a third passband, the first passband and the third passband associated with a same frequency band range,
wherein the at least one switch module includes a first switch and a second switch, the first switch connected between the first input terminal and the first input node of the input inductor, the second switch connected between the third input terminal and the first input node.

9. The integrated circuit of claim 7, wherein:
the at least one switch module comprises:
a first switch module including at least a switch, the switch connected between the first input terminal and the first input node of the input inductor; and
a second switch module including at least another switch, the other switch connected between the second input terminal and the second input node of the input inductor.

10. The integrated circuit of claim 1, wherein the first input node of the input inductor and the second input node of the input inductor comprise different taps on the input inductor.

11. The integrated circuit of claim 1, wherein:
the input inductor comprises a conductor; and
the first input node and the second input node are connected to the conductor at different locations along a length of the conductor.

12. The integrated circuit of claim 11, wherein:
the conductor has at least one loop formed about a center axis; and
the first input node and the second input node are connected to the conductor at different points along the at least one loop.

13. The integrated circuit of claim 1, wherein the input inductor and the at least two degeneration inductors are implemented on different metal layers of the integrated circuit.

14. The integrated circuit of claim 1, wherein the input inductor and each of the at least two degeneration inductors have different center axes that are substantially parallel to each other.

15. The integrated circuit of claim 1, wherein the input inductor and the at least two degeneration inductors have a same center axis.

16. An integrated circuit comprising:
at least two input terminals configured to respectively connect to at least two band-pass filters, the at least two band-pass filters associated with different frequency band ranges;
at least two amplifier branches, the at least two amplifier branches including:

a first amplifier branch having a first node, a first input transistor, and a first cascode stage; the first input transistor having a first gate, a first source, and a first drain, the first gate connected to the at least two input terminals and the first source connected to a ground; the first cascode stage connected between the first drain and the first node; and a second amplifier branch having a second node, a second input transistor, and a second cascode stage; the second input transistor having a second gate, a second source, and a second drain, the second gate connected to the first gate and the second source connected to the ground; the second cascode stage connected between the second drain and the second node, the second node connected to the first node; and inductive means for providing different inductances from each of the at least two input terminals to the first gate and magnetically coupling together the first gate, the second gate, the first source, and the second source; the inductive means configured to produce, based on a first current that flows from the first source to the ground and a second current that flows from the second source to the ground, a portion of a third current that flows from one of the at least two input terminals towards the first gate and the second gate.

17. The integrated circuit of claim 16, wherein the inductive means is configured to produce a portion of the second current based on the first current.

18. The integrated circuit of claim 16, further comprising:
switching means for selectively connecting the first gate and the second gate to a first input terminal of the at least two input terminals or a second input terminal of the at least two input terminals, wherein:
the first input terminal is configured to connect to a first band-pass filter of the at least two band-pass filters; and
the second input terminal is configured to connect to a second band-pass filter of the at least two band-pass filters.

19. The integrated circuit of claim 18, wherein:
the at least two amplifier branches and the inductive means comprise a low-noise amplifier; and
the inductive means is configured to cause an input impedance of the low-noise amplifier to match an output impedance of the first band pass filter or the second band-pass filter.

20. The integrated circuit of claim 19, wherein:
the at least two amplifier branches are configured to have a first gain associated with the first current being non-zero and the second current being non-zero;
the at least two amplifier branches are configured to have a second gain associated with the first current being zero and the second current being non-zero; and
the inductive means is further configured to cause the input impedance of the low-noise amplifier to be substantially similar for the first gain as for the second gain.

21. A method for gain-dependent impedance matching and linearity, the method comprising:
generating a mutual inductance between multiple degeneration inductors, the multiple degeneration inductors respectively connected between multiple amplifier branches and a ground;
generating another mutual inductance between an input inductor and the multiple degeneration inductors, at least a portion of the input inductor connected between the multiple amplifier branches and at least two band-pass filters, the at least two band-pass filters associated with different frequency band ranges and connected to respective input nodes of the input inductor;

providing, via the input inductor, an inductance that is different at the respective input nodes;

causing, based on the inductance, the mutual inductance, and the other mutual inductance, an input impedance of an amplifier to facilitate passing of a communication signal from one of the at least two band-pass filters to the amplifier, the amplifier including the multiple degeneration inductors, the multiple amplifier branches, and the input inductor; and amplifying the communication signal using one or more of the multiple amplifier branches.

22. The method of claim 21, wherein the causing the input impedance of the amplifier to facilitate passing of the communication signal comprises:

causing the input impedance to substantially match an output impedance of the one of the at least two band-pass filters; and causing the input impedance to substantially achieve a target noise figure for the amplifier.

23. The method of claim 21, further comprising:

controlling, via the multiple amplifier branches, the amplifying of the communication signal, wherein the causing the input impedance of the amplifier to facilitate passing of the communication signal comprises causing the input impedance of the amplifier to facilitate passing of the communication signal for two different amplification amounts.

24. The method of claim 21, further comprising:

disconnecting a first input node of the input inductor from the one of the at least two band-pass filters; and connecting a second input node of the input inductor to another one of the at least two band-pass filters.

25. An apparatus comprising:

at least two band-pass filters having different passbands, the different passbands associated with different frequency band ranges, each band-pass filter of the at least two band-pass filters is configured to filter a received signal to produce a filtered signal;

at least one switch module connected to the at least two band-pass filters, the at least one switch module configured to pass the filtered signal from a selected band-pass filter of the at least two band-pass filters;

an amplifier circuit connected to the at least one switch module, the amplifier circuit including at least two amplifier branches, the amplifier circuit configured to amplify the filtered signal that is passed by the at least one switch module using one or more of the at least two amplifier branches; and multiple inductors including:

an input inductor having an inductance, at least a portion of the input inductor connected between the at least one switch module and the amplifier circuit, the input inductor configured to provide different amounts of the inductance between each of the at least two band-pass filters and the amplifier circuit; and at least two degeneration inductors having other inductances, the at least two degeneration inductors respectively connected between the at least two amplifier branches of the amplifier circuit and a ground, the at least two degeneration inductors magnetically coupled to each other and the input inductor with respective coupling coefficients, the multiple inductors configured to cause an input impedance associated with the amplifier circuit and the multiple inductors to approximately equal an output impedance of the selected band-pass filter based on the respective coupling coefficients, the inductance of the input inductor, and the other inductances of the at least two degeneration inductors.

26. The apparatus of claim 25, further comprising:

at least one other band-pass filter associated with a same frequency band range as one of the at least two band-pass filters, wherein the at least one switch module a first switch and a second switch, the first switch connected between the at least one other band-pass filter and an input node of the input inductor, the second switch connected between the one of the at least two band-pass filters and the input node.

27. The apparatus of claim 25, wherein:

the at least one switch module includes at least two switch modules respectively connected between the at least two band-pass filters and at least two input nodes of the input inductor.

28. The apparatus of claim 25, further comprising a controller configured to:

cause, based on the received signal and an associated frequency band of the selected band-pass filter, the at least one switch module to connect the selected band-pass filter to the amplifier circuit; and enable different combinations of the at least two amplifier branches of the amplifier circuit to amplify the filtered signal, the different combinations configured to provide different amounts of amplification for the filtered signal, wherein the multiple inductors are configured to cause the amplifier circuit to behave substantially linearly for the different combinations of the at least two amplifier branches.

29. The apparatus of claim 28, wherein:

each of the at least two amplifier branches include a cascode stage; and the controller is further configured to enable different combinations of the at least two amplifier branches by controlling bias voltages that are applied to respective cascode stages of the at least two amplifier branches.

30. The apparatus of claim 25, wherein the multiple inductors are concentric with respect to each other.

* * * * *